(12) United States Patent
Heller et al.

(10) Patent No.: US 11,967,869 B2
(45) Date of Patent: Apr. 23, 2024

(54) PASSIVE COMPONENT FOR DETECTING AN ELECTRICAL OVERLOAD IN ELECTRICALLY ROTATING MACHINES

(71) Applicant: Innomotics GmbH, Nuremberg (DE)

(72) Inventors: Janis Heller, Bad Neustadt (DE); Tobias Katzenberger, Bad Königshofen STT Untereßfeld (DE); Marek Maleika, Fürth (DE); Bastian Plochmann, Neustadt an der Aisch (DE)

(73) Assignee: INNOMOTICS GMBH, Nuremberg (DE)

( * ) Notice: Subject to any disclaimer, the term of this patent is extended or adjusted under 35 U.S.C. 154(b) by 1059 days.

(21) Appl. No.: 16/646,809

(22) PCT Filed: Sep. 21, 2018

(86) PCT No.: PCT/EP2018/075561
§ 371 (c)(1),
(2) Date: Mar. 12, 2020

(87) PCT Pub. No.: WO2019/063423
PCT Pub. Date: Apr. 4, 2019

(65) Prior Publication Data
US 2020/0274428 A1   Aug. 27, 2020

(30) Foreign Application Priority Data

Sep. 28, 2017  (EP) ..................................... 17193682

(51) Int. Cl.
*H02K 15/12* (2006.01)
*C09B 21/00* (2006.01)
(Continued)

(52) U.S. Cl.
CPC ........... *H02K 15/125* (2013.01); *C09B 21/00* (2013.01); *C09D 7/62* (2018.01); *G01R 13/12* (2013.01);
(Continued)

(58) Field of Classification Search
None
See application file for complete search history.

(56) References Cited

U.S. PATENT DOCUMENTS

| 5,550,631 A | 8/1996 | Shapanus et al. ............. 356/300 |
| 7,659,728 B1 | 2/2010 | Watkins, Jr. ................... 324/551 |

(Continued)

FOREIGN PATENT DOCUMENTS

| CH | 486 149 A | 2/1970 | ............. G01R 31/34 |
| CN | 101535818 A | 9/2009 | ............. G01R 15/06 |

(Continued)

OTHER PUBLICATIONS

Extended European Search Report, Application No. 17193682.6, 11 pages, dated Apr. 6, 2018.

(Continued)

*Primary Examiner* — Jermele M Hollington
(74) *Attorney, Agent, or Firm* — Slayden Grubert Beard PLLC (57) ABSTRACT

Various embodiments include a passive component comprising: a substrate; and two conductor tracks disposed on the substrate. The substrate forms an electrically insulating bridge between at least two phases of an electrically rotating machine. Each of the two conductor tracks is coupled to a separate phase of the at least two phases so an electrical potential across the electrically insulating bridge is the same as in the insulation system of the machine and the potential load on the passive component corresponds to the potential load on the insulation system.

10 Claims, 5 Drawing Sheets

(51) Int. Cl.
  *C09D 7/62* (2018.01)
  *G01R 13/12* (2006.01)
  *G01R 31/12* (2020.01)
  *G01R 31/34* (2020.01)
  *H01B 3/40* (2006.01)
  *H02K 3/40* (2006.01)
  *C09B 69/00* (2006.01)

(52) U.S. Cl.
  CPC ....... *G01R 31/1218* (2013.01); *G01R 31/343* (2013.01); *H01B 3/40* (2013.01); *H02K 3/40* (2013.01); *C09B 69/00* (2013.01)

(56) References Cited

U.S. PATENT DOCUMENTS

| | | | | |
|---|---|---|---|---|
| 7,990,156 | B1* | 8/2011 | Watkins, Jr. | G01R 31/343 |
| | | | | 324/546 |
| 8,908,252 | B2 | 12/2014 | Sotzing et al. | 359/265 |
| 9,300,135 | B2 | 3/2016 | Ichikawa et al. | |
| 9,418,857 | B2 | 8/2016 | Fix et al. | |
| 10,908,217 | B2* | 2/2021 | Heller | G01R 31/1272 |
| 11,165,310 | B2* | 11/2021 | Sewiolo | H02K 3/50 |
| 2010/0079027 | A1* | 4/2010 | Baumann | H02K 3/40 |
| | | | | 310/196 |
| 2015/0000376 | A1 | 1/2015 | Fix et al. | 73/31.06 |
| 2017/0310184 | A1 | 10/2017 | Huber et al. | |
| 2018/0053581 | A1 | 2/2018 | Huber et al. | |
| 2019/0204389 | A1* | 7/2019 | Heller | G01R 31/346 |

FOREIGN PATENT DOCUMENTS

| | | | | |
|---|---|---|---|---|
| CN | 102338843 | A | 2/2012 | G01R 31/12 |
| CN | 102369478 | A | 3/2012 | G02F 1/153 |
| CN | 102804549 | A | 11/2012 | H01F 38/00 |
| CN | 104345076 | A | 2/2015 | G01N 27/12 |
| CN | 105044563 | A | 11/2015 | G01R 31/08 |
| CN | 105282970 | A | 1/2016 | H05K 1/11 |
| CN | 105632633 | A | 6/2016 | H01B 13/00 |
| CN | 208383971 | U | 1/2019 | G01R 19/145 |
| DE | 10 2004 034 550 | A1 | 2/2006 | H01B 3/02 |
| DE | 10 2014 219 844 | A1 | 3/2016 | H01B 3/30 |
| EP | 3 082 233 | A1 | 10/2016 | G01R 31/12 |
| WO | 2016/050450 | A1 | 4/2016 | H01B 3/40 |
| WO | 2016/146446 | A1 | 9/2016 | C08G 59/50 |
| WO | 2019/063423 | A1 | 4/2019 | G01R 13/00 |

OTHER PUBLICATIONS

International Search Report and Written Opinion, Application No. PCT/EP2018/075561, 16 pages, dated Dec. 19, 2018.
Chinese Office Action, Application No. 201880062162.4, 17 pages, dated Aug. 17, 2021.
Wang, Jianguo et al., "Functional Polymers," Materials Science and Engineering Graduates Textbook, ISBN 7-5628-1914-9/ TQ, p. 217 (7 total pages) (Chinese w/ English translation).

* cited by examiner

Structure 1

FIG 6

Structure 2

FIG 7

Structure 3

Structure 4

Polymethine cations

Structure 5

Structure 6

Polymethine anions

FIG. 8

PASSIVE COMPONENT FOR DETECTING AN ELECTRICAL OVERLOAD IN ELECTRICALLY ROTATING MACHINES

CROSS-REFERENCE TO RELATED APPLICATIONS

This application is a U.S. National Stage Application of International Application No. PCT/EP2018/075561 filed Sep. 21, 2018, which designates the United States of America, and claims priority to EP Application No. 17193682.6 filed Sep. 28, 2017, the contents of which are hereby incorporated by reference in their entirety.

TECHNICAL FIELD

The present disclosure relates to electric motors. Various embodiments may include passive components for establishing the quality and condition of the insulation system of an electric motor, e.g., to make a prediction before the failure of the motor, for example a breakdown between two phases.

BACKGROUND

Figure 1:
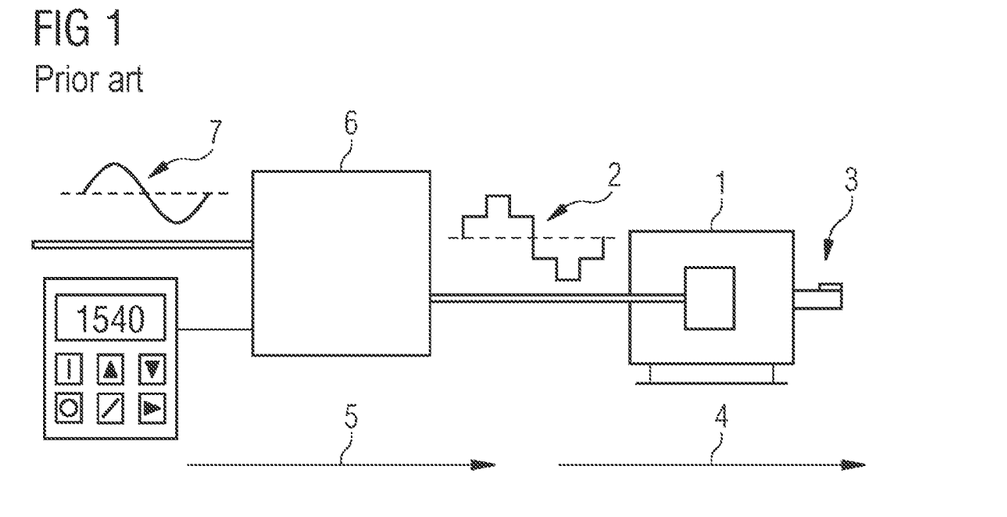
FIG. 1 is a diagram illustrating the principle of an inverter according to the prior art.

Three-phase electric motors for mains voltages of—for example—up to 690 V are typically operated by means of an inverter or are in an inverter-fed environment. This is advisable in order to generate controlled voltage values in the form of square-wave voltages for the speed to be controllable as desired and to enable maximum efficiency of operation of the motor. The principle of an inverter according to the prior art is shown in FIG. 1. FIG. 1 shows the transformation 5 of a sinusoidal oscillation 7 by means of a frequency controller 6 to a square-wave voltage 2, which is transformed by the energy transformation 4 to mechanical energy 3 in the AC motor 1. It can be seen how square-wave voltages 2 are transformed to mechanically utilizable energy 3 in the AC motor 1. Since square-wave voltages 2 are a multitude of superposed sinusoidal oscillations 7 with very high frequencies, as elucidated in detail in relevant textbooks relating to Fourier transformation, pulse-like overvoltages arise in the flank region, which run as waves through the winding of the insulation system. The insulation system itself, according to prior art, comprises, for example, a metal wire, especially copper wire, which is lacquer-insulated, the lacquer being formed, for example, on the basis of a polyesterimide, amide imide polymer. Above that are conventionally surface insulants which are, for example, multilayer laminates based on polyester and/or meta-aramid, and have been cast with an impregnating resin, for example a polyester resin, that has preferably been filled. In spite of these sophisticated insulation systems, erosion will always occur because the insulation system is simply not designed for the overvoltages that occur, which can be several times the operating voltages.

Owing to the fact that pores and gaps on the micrometer to millimeter scale are present in a real insulation construction, the number of which can be minimized but which cannot be completely avoided by the real operation of manufacturing the insulation system, i.e. impregnation and encapsulation, there will necessarily be partial discharges in the event of voltage peaks. Owing to the usually relatively small dielectric constant and the defect sites (field displacement), according to Paschen's law, discharge occurs over and above a certain field strength at standard pressure, as shown in FIG. 2, i.e. voltage power per unit pore diameter, through an avalanche effect of the charge carriers, as can be seen in FIG. 3.

Figure 2:
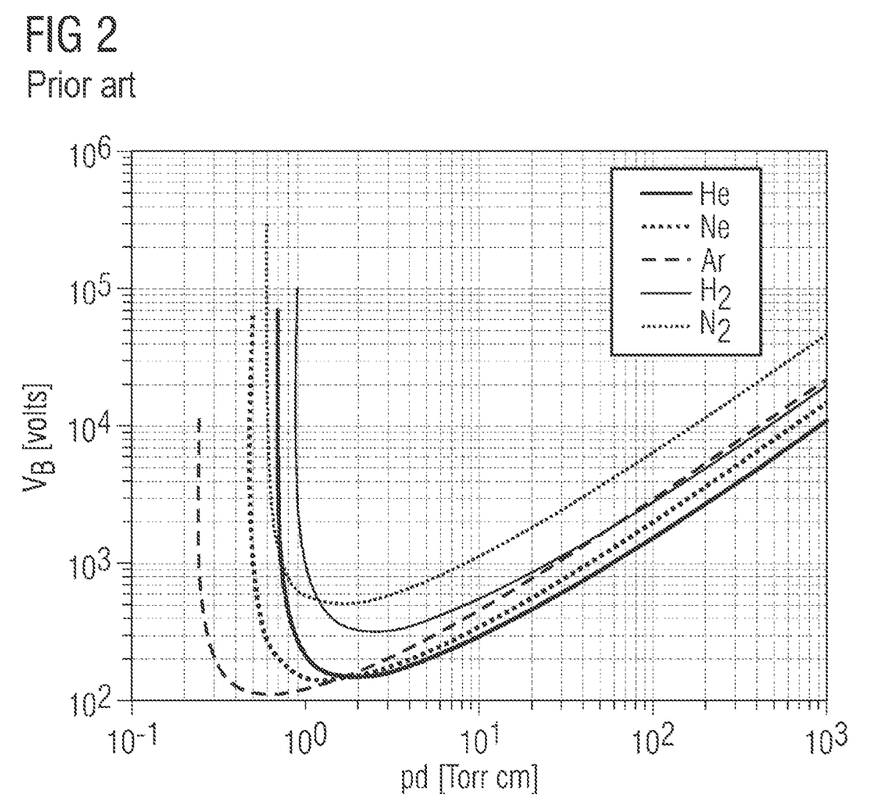
FIG. 2 shows a graph that illustrates the relationship from which Paschen's law was formulated.
Figure 3:
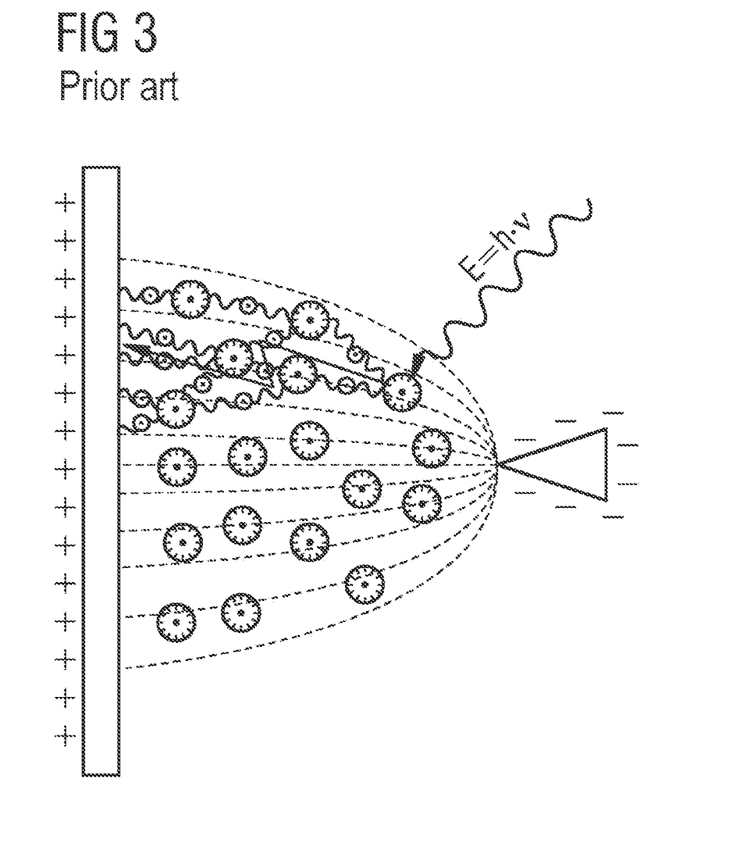
FIG. 3 shows the scheme of the formation of partial charges through the avalanche effect.

FIG. 2 shows a graph that illustrates the relationship from which Paschen's law was formulated. FIG. 3 shows the scheme of the formation of partial charges through the avalanche effect.

Organic insulants, for example the abovementioned impregnating resins that are used in the insulation systems, are successively degraded by the energy of the partial discharges, such that the insulation system is preferentially damaged at existing defect sites and these increase in size until failure occurs.

The quality and condition of the insulation system of a motor are difficult to establish quantitatively from the outside, which ultimately makes it impossible to predict the actual total failure—for example in the form of a breakdown between two phases or to ground or two wires—when the machine is running. After total failure, it is possible to evaluate the progression of damage and mechanism of damage by deinstalling the windings from the stator core and by visual assessment, but it is usually not possible to draw any conclusion as to possible excess external voltage in the consumer grid, for example voltage peaks resulting from inverter operation or excessively high operating voltage.

There is therefore a need to obtain information relating to excess operating voltage and voltage peaks during operation in order to gain a better technical understanding of the insulation system under load.

SUMMARY

The teachings of the present disclosure describe various embodiments of a passive component that can be connected to the motor in operation without intervention and gives a statement as to the loads to which the insulation system is already subject and/or to which it has already been subjected. For example, some embodiments include a passive component comprising a substrate and at least two conductor tracks thereon in such a way that the substrate forms an electrically insulating bridge between at least two phases of an electrically rotating machine and the conductor tracks are each coupled to one phase in order that the electrical potential across the electrically insulating bridge is the same as in the insulation system of the machine, such that the potential load on the passive component corresponds to the potential load on the insulation system.

In some embodiments, the component takes the form of a test strip.

In some embodiments, the component is disposed in the terminal box of a motor.

In some embodiments, the conductor tracks are made of a composite material.

In some embodiments, the shape and position of the conductor tracks on the substrate is chosen such that no partial discharge via the conductor tracks of the passive component takes place at the operating voltage of the electrically rotating machine.

In some embodiments, the composite material comprises an epoxy resin filled at least up to the percolation threshold with electrically conductive filler.

In some embodiments, the composite material comprises a dye that changes color when electrical energy is supplied.

In some embodiments, the composite material comprises a dye that can be broken down when electrical or thermal energy is supplied.

In some embodiments, the dye is selected from the group of the aromatic heterocycles.

In some embodiments, the dye is selected from the group of the following structures 1 to 6:

Structure 1

Structure 2

Structure 3

Polymethine cations

Structure 4

Structure 5

Polymethine anions

Structure 6 where $R^1$ is —CH—, -conjugated alkyl, -aryl, —N—, —P—, —S—, —O—, and any desired combinations of these substituents;

$R^2$ and $R^3$ may each be the same or different and are any alkyl and aryl substituents with or without halide substitution, and the cations or anions of the polymethine ions are present individually or in combination and are selected from the following ionogenic groups:

monovalent inorganic or organic cations, especially metal cations divalent cations, especially alkaline earth metal cations organic nitrogen-containing cations trimethylhydrogenammonium triethylhydrogenammonium halide ions, such as Cl$^-$, Br$^-$;

tetrafluoroborate anion $BF_4^-$;

hexafluorophosphate anion $PF_6^-$;

monovalent organic anions.

In some embodiments, the electrically conductive filler in the composite material is in platelet form and/or globular form.

In some embodiments, the electrically conductive filler in the composite material is light-colored and/or colorless.

In some embodiments, the square resistance of the respective conductor track at a layer thickness in the range from 50 μm to 500 μm is in the range from $10^2$ to $10^7$.

In some embodiments, there is at least one conductor track having a layer thickness in the range from 70 μm to 200 μm with a square resistance in the range from $10^3$ to $10^5$ ohms.

In some embodiments, the component is producible by printing, spraying, dispensing, and/or embossing the substrate with the uncured composite material.

BRIEF DESCRIPTION OF THE DRAWINGS

Various aspects of the present disclosure and the teachings herein are reflected in the Figures, in which.

DETAILED DESCRIPTION

Some embodiments of the teachings herein include a passive component comprising a substrate and at least two conductor tracks thereon in such a way that the substrate forms an electrically insulating bridge between at least two phases of an electrically rotating machine and the conductor tracks are each coupled to one phase in order that the electrical potential across the electrically insulating bridge is the same as in the insulation system of the machine, such that the potential load on the passive component corresponds to the potential load on the insulation system.

In some embodiments, the condition of the conductor tracks can be read off from a dye integrated in the conductor tracks. It is possible here, for example, to draw conclusions as to the intensity and duration of overvoltages and hence partial discharges in the windings of the motor from the spread and extent of the color change; because the organic dye breaks down as result of the local input of energy, it is possible to record and evaluate the duration and intensity of the overvoltage in the course of operation of the motor via the color change of the composite material and/or the conductor track. Total failures are thus avoided.

In some embodiments, multiple, for example 3, phases are present in the terminal region of the motor, for example the terminal board, the terminal box and/or the distributor. These are insulated from one another, and hence it is possible to tap the voltage differential present in the insulation system, for example in the windings, from the individual phase terminals. It is therefore possible, by means of conductor tracks in a structure which is insulating in the middle region and forms partial discharges according to the potential applied, depending on the radius and separation, by skillful choice of signals, for example a dye that can be destroyed by partial discharges and hence loses color, to determine when voltage peaks occur at the phase terminals and hence in the insulation system.

In some embodiments, the conductor tracks lie on an electrically insulating substrate that forms an electrically insulating bridge between the phase terminals. The substrate may be in the form of a platelet and/or a film and has been produced, for example, from standard surface insulants, especially such as multilayer laminates based on polyester and/or meta-aramid. These may also be reinforced, for example, with glass fibers.

In some embodiments, the passive component is in the form of a simple test strip that can be mounted without difficulty between two phases in the terminal box of an electrical machine even during operation, for example by adhesive bonding and/or screw connection, wherein the geometry of the at least two conductor tracks each coupled to one phase terminal in the terminal box is chosen such that a region of the passive component between the conductor tracks is electrically insulated and hence no short circuit arises between the conductor tracks.

For production of the passive component, for example, two conductor tracks made of a composite material filled with electrically conductive filler at least up to the percolation threshold are disposed atop and/or beneath the substrate. For example, the composite material on the substrate has a square resistance at a layer thickness of about 50 μm to 500 μm of below 100 kohm. In the case of excessively large square resistance—depending on the geometry—the problem arises that the voltage peaks are already dissipated in one or both of the conductor tracks.

If the signal or scale chosen is a color change of a color pigment integrated into the conductor track material, the electrically conductive composite material from which the conductor tracks have been produced may itself be light-colored and/or colorless. Especially suitable for this purpose are impregnating resins that are themselves colorless and have been filled with light-colored conductive or part-conductive particles.

In some embodiments, resins used are the epoxy resins customary for impregnation, either with acid anhydride-containing curing agents, as is still the current state of the art, and/or with acid anhydride-free curing agents, such as ammonium, sulfonium, phosphonium and/or iodonium curing agents, and curing agents formed from tertiary amines or imidazole and/or pyrazole compounds. These are extensive and are also known, for example, from EP 3175462.

The filler particles may comprise particles in platelet form and/or spherical particles, for example based on mica and/or quartz flour. In some embodiments—again by way of example—they are coated with a light-colored, doped metal oxide and hence rendered conductive. The filler particles may also be in uncoated form and/or may be made solely from doped metal oxide.

Conductor tracks produced in this way are colorless or at least quite light-colored, such that they can be colored by addition of dye even in quite small amounts. In operation, the dye is destroyed by partial discharges or voltage peaks and the color of the conductor track disappears again. This makes it possible to make a statement as to the load on the insulation system during operation. It is possible here to use all kinds of dyes that can be integrated in the composite material and/or in the material of the substrate for production of the conductor tracks, and change or are degraded in terms of their optical properties by partial discharges.

For example, a composition as follows is suitable as a mixture for production of a conductor track:

0.3% to 7% by weight, especially 0.7% to 5% by weight and especially 0.8 to 2.5% by weight of dye;

5% to 50% by volume of filler, especially 20% to 50% by volume of filler, or at least filler in such an amount in which it is above the percolation threshold; and epoxy resin in an amount that printing is possible with or without solvent, for example an amount of at least 15% by weight, especially at least 20% by weight and preferably at least 30% by weight.

One example described is the production of a conductor track:

about 1% by weight of dye, about 50% by weight of doped tin oxide filler and

49% by weight of epoxy resin with curing agent are processed to give a coatable mixture and then applied to the substrate by means of a coating bar.

In some embodiments, the conductor tracks can be applied atop and/or beneath the substrate by means of printing, screen printing, dispenser printing, brushing, embossing, spraying and/or dispensing.

In some embodiments, the square resistance of the respective conductor track at a layer thickness in the range from 50 μm to 500 μm is in the range from $10^2$ to $10^7$; in particular, square resistance may be in the range from $10^3$ to $10^3$ ohms at a layer thickness in the range from 70 μm to 200 μm. For example, a conductor track applied by printing has a square resistance at a layer thickness of 100 μm of about $10^4$ ohms.

Figure 4:
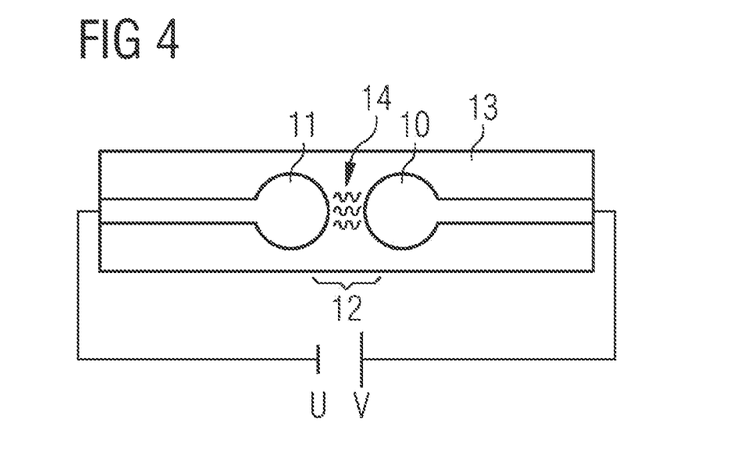
FIG. 4 shows a passive component in the form of a test strip incorporating teachings of the present disclosure.

FIG. 4 shows a correspondingly manufactured passive component in the form of a test strip 13. The two conductor tracks 10, 11 are apparent, each of which is connected to one phase U, V. Between the two conductor tracks 10, 11 is the middle region 12 that shows exposed substrate and is electrically insulated. Depending on the radius and separation between the ends of the two conductor tracks, according to the potential applied, there are partial discharges 14 here, which break down the dye 15 which is integrated in and colors the conductor tracks 10, 11. In the working example shown here, the color change in the conductor tracks can demonstrate the existence of a voltage peak or a partial discharge.

Figure 8:
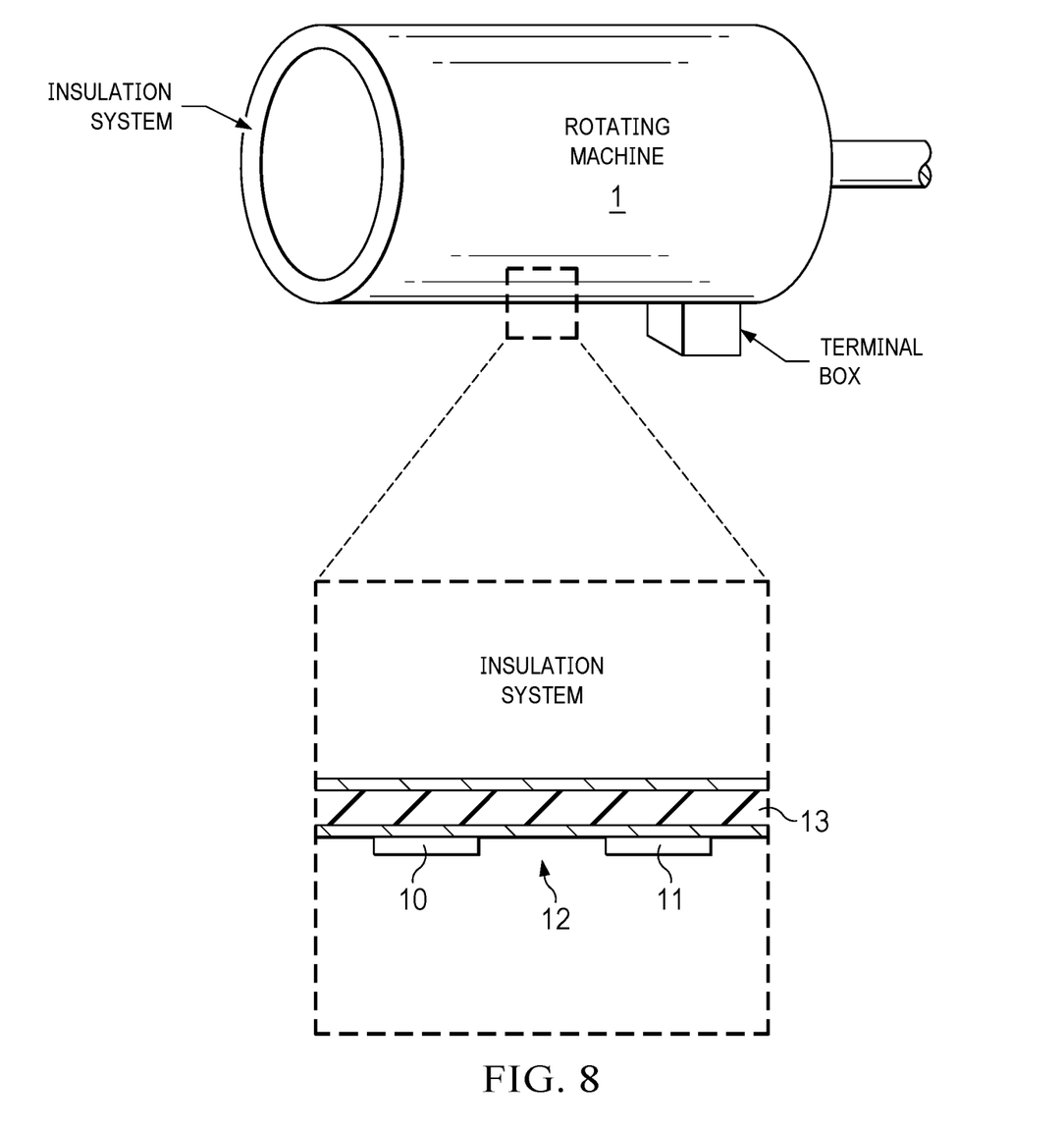
FIG. 8 is a drawing showing an example rotating machine with a passive component incorporating teachings of the present disclosure.

FIG. 8 shows an example rotating machine with a passive component incorporating teachings of the present disclosure. The rotating machine shown is an electric motor 1 and the passive component is a test strip 13. The electric motor includes an insulation system and a terminal box. Test strip 13 includes a substrate with a first conductor track 10 and a second conductor track 11 thereon and a middle region separating the two. As shown, the substrate of the test strip 13 includes a conductive filler dispersed in an epoxy resin.

In some embodiments, the two conductor tracks are on the same side of the substrate, but they may also be on opposite sides of the substrate, such that there is a partial discharge through the substrate.

In some embodiments, the geometry of the two conductor tracks, especially their separation and radius, is matched to the insulation system to be examined in each case such that there is just no onset of partial discharges at operating voltage of the motor. By means of various geometries of the conductor tracks, different field strengths may be generated at the same voltage, and hence fine differentiation of the degree of damage can be established by optical analysis. In some embodiments, the test strip is integrated into the terminal board of the motor between two phases. Thus, the electrical voltage across the test strip is the same as in the insulation system and, therefore, partial discharge detectable via loss of color is possible in the event of occurrence of voltage peaks.

In a test, a test voltage of 6 kV was applied over several hours, as a result of which the integrated dye was locally degraded. On reduction of the duration and intensity, the radius of the color change was smaller but was still sharply apparent. The spread and extent of the color change thus permit conclusions as to the intensity and duration of action of overvoltages and hence partial discharges in the insulation system.

Figure 5:
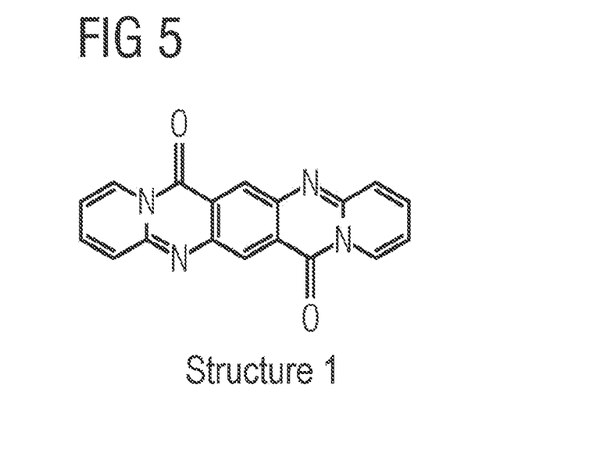
FIGS. 5-7 are diagrams showing the composition of various example dyes used to practice teachings of the present disclosure.
Figure 6:
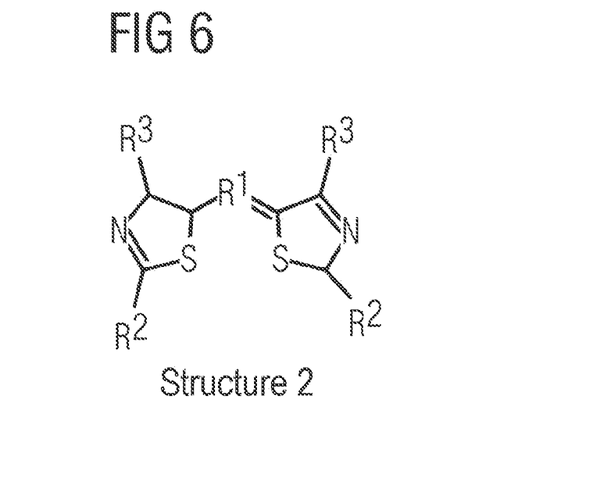
Figure 7:
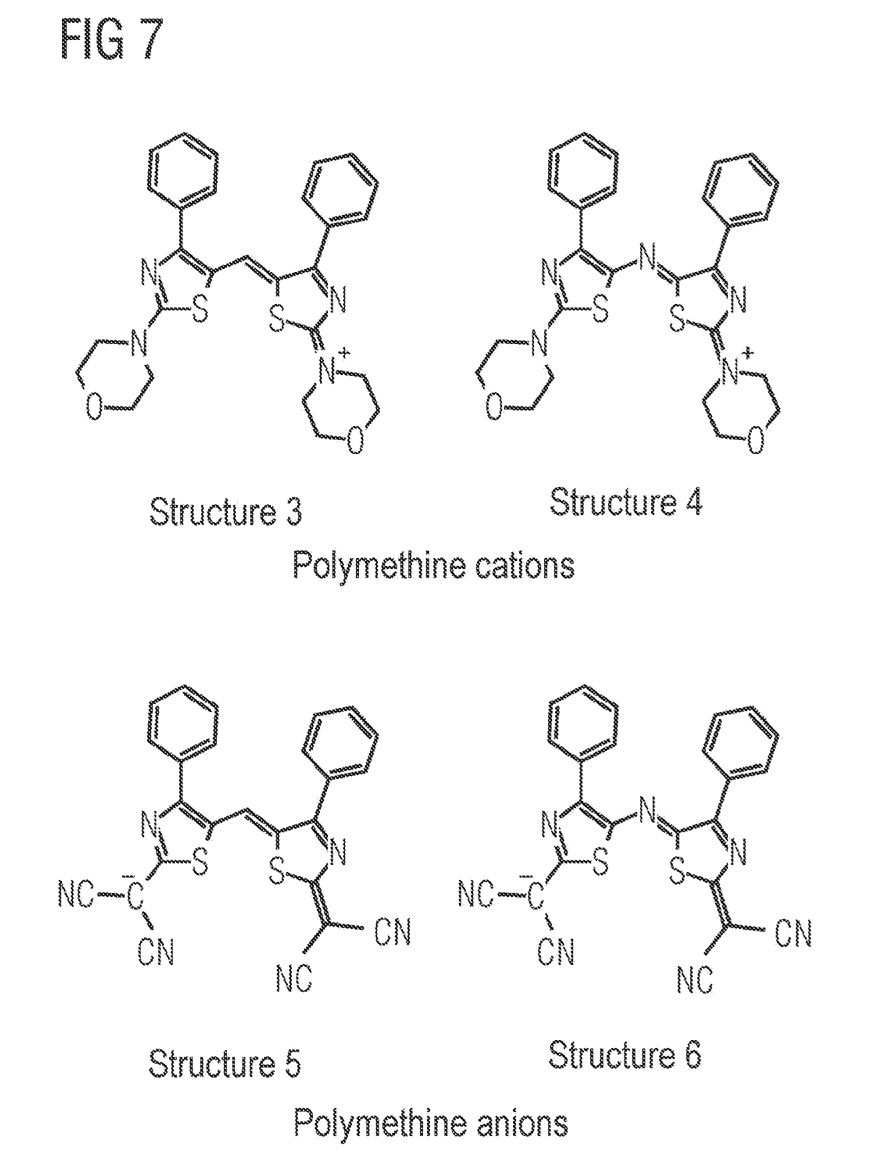

Dyes used by way of example are the following compounds as shown in structures 1 to 6, for example, that can be seen in FIGS. 5 to 7. The substituent $R^1$ here is CH, conjugated alkyl spacer, i.e. an alkyl substituent having double bond(s), and nitrogen, sulfur, phosphorus, oxygen and further substituents that enable conjugation between the donor and acceptor of the polymethines and hence bring about both an intense color and stability of the molecule. The $R^2$ and $R^3$ radicals may be the same or different and are any desired alkyl and aryl substituents, including with chloride and/or fluoride substituents, and further groups that promote, for example, the formation of polymethine cations and/or polymethine anions.

In some embodiments, polymethine cations or polymethine anions are used in the form of their salts, where the respective counterpart(s) may be selected individually or in any combinations from the group of the following ions:
Cations:
    monovalent inorganic or organic cations, especially metal cations
    divalent cations, especially alkaline earth metal cations
    organic nitrogen-containing cations
    trimethylhydrogenammonium
    triethylhydrogenammonium
Anions:
    halide ions, such as Cl$^-$, Br$^-$;
    tetrafluoroborate anion $BF_4^-$;
    hexafluorophosphate anion $PF_6^-$;
    monovalent organic anions.

In some embodiments, there is a passive component such as a test strip by means of which the loads that act on the insulation system, for example the winding, as a result of partial discharges and/or voltage peaks are detectable—for example by optical means—during operation of an electrical machine.

What is claimed is:

1. A passive component for detecting electrical overload in an insulation system of a rotating electric machine, the component comprising:
    a substrate; and
    a first conductor track and a second conductor track truths disposed on the substrate;
    wherein the first conductor track is coupled to the first phase of the electric machine, and the second conductor track is coupled to the second phase of the electric machine;
    wherein the substrate provides an electrically insulating bridge between the first phase and the second phase of the electric machine so an electrical potential defined across the electrically insulating bridge is the same as in an insulation system of the electric machine and a potential load on the passive component corresponds to a potential load on the insulation system;
    wherein a middle region of the substrate exposes the substrate between the first conductor track and the second conductor track;
    wherein the first conductor track and the second conductor track comprise a composite material with a dye configured to change color when exposed to electrical energy;
    wherein respective free ends of the first conductor track and the second conductor track create partial discharges in the middle region according to an electrical potential applied.

2. The passive component as claimed in claim 1, wherein the passive component comprises a test strip.

3. The passive component as claimed in claim 1, wherein the passive component is disposed in a terminal box of a motor.

4. The passive component as claimed in claim 1, wherein the composite material comprises an epoxy resin filled at least up to a percolation threshold of the epoxy resin with electrically conductive filler.

5. The passive component as claimed in claim 1, wherein the composite material comprises an epoxy resin filled at least up to a percolation threshold of the epoxy resin with electrically conductive filler.

6. The passive component as claimed in claim 5, wherein the dye breaks down when electrical or thermal energy is supplied.

7. The passive component as claimed in claim 5, wherein the dye is selected from the group consisting of the structures 1 to 6:

Structure 1

Structure 2

Structure 3

Polymethine cations

Structure 4

Structure 5

Polymethine anions

Structure 6 where
$R^1$ is —CH—, -conjugated alkyl, -aryl, —N—, —P—, —S—, —O—, and any desired combinations of these substituents;

$R^2$ and $R^3$ may each be the same or different and are any alkyl and aryl substituents with or without halide substitution, and the cations or anions of the polymethine ions are present individually or in combination and are selected from the following ionogenic groups:

monovalent inorganic or organic cations, especially metal cations;
divalent cations, especially alkaline earth metal cations;
organic nitrogen-containing cations;
trimethylhydrogenammonium;
triethylhydrogenammonium;
halide ions, such as $Cl^-$, $Br^-$;
tetrafluoroborate anion $BF_4^-$;
hexafluorophosphate anion $PF_6^-$; and
monovalent organic anions.

8. The passive component as claimed in claim 5, wherein the electrically conductive filler in the composite material is light-colored or colorless.

9. The passive component as claimed in claim 1, wherein a square resistance of each respective conductor track is in the range from $10^2$ to $10^7$ a layer thickness in the range from 50 μm to 500 μm.

10. The passive component as claimed in claim 1, wherein at least one of the conductor tracks has a layer thickness in the range from 70 μm to 200 μm and a square resistance in the range from $10^3$ to $10^5$.

* * * * *